United States Patent [19]

Schutz

[11] Patent Number: 4,682,124
[45] Date of Patent: Jul. 21, 1987

[54] CIRCUIT INCLUDING A DC-FM PHASE LOCKED LOOP

[75] Inventor: Johann Schutz, Munich, Fed. Rep. of Germany

[73] Assignee: Schlumberger Messgerate GmbH, Munich, Fed. Rep. of Germany

[21] Appl. No.: 908,477

[22] Filed: Sep. 17, 1986

[30] Foreign Application Priority Data

Sep. 18, 1985 [DE] Fed. Rep. of Germany ....... 3433222

[51] Int. Cl.$^4$ .............................................. H03C 3/06
[52] U.S. Cl. ........................................ 332/19; 331/23; 455/113
[58] Field of Search ............... 332/16 R, 19; 331/1 A, 331/16, 17, 18, 23, 25; 455/112, 113, 126

[56] References Cited

U.S. PATENT DOCUMENTS

| 4,286,237 | 8/1981 | James ................................. 331/23 X |
| 4,313,209 | 1/1982 | Drucker ............................ 331/23 X |
| 4,610,030 | 9/1986 | Dominguez et al. ............. 331/23 X |

FOREIGN PATENT DOCUMENTS

| 0044155 | 1/1982 | European Pat. Off. . |
| 0664014 | 1/1952 | United Kingdom . |

Primary Examiner—Eugene R. LaRoche
Assistant Examiner—Robert J. Pascal
Attorney, Agent, or Firm—Dale Gaudier

[57] ABSTRACT

The invention provides a DC-FM phase locked loop for use in transmitters for measuring and control purposes, wherein the modulation signal controls, via an A/D converter, the output frequency of a frequency synthesizer, this output frequency being used as the reference for the phase comparator. This permits modulation with extremely low frequencies or DC without the necessity to interrupt the loop.

5 Claims, 1 Drawing Figure

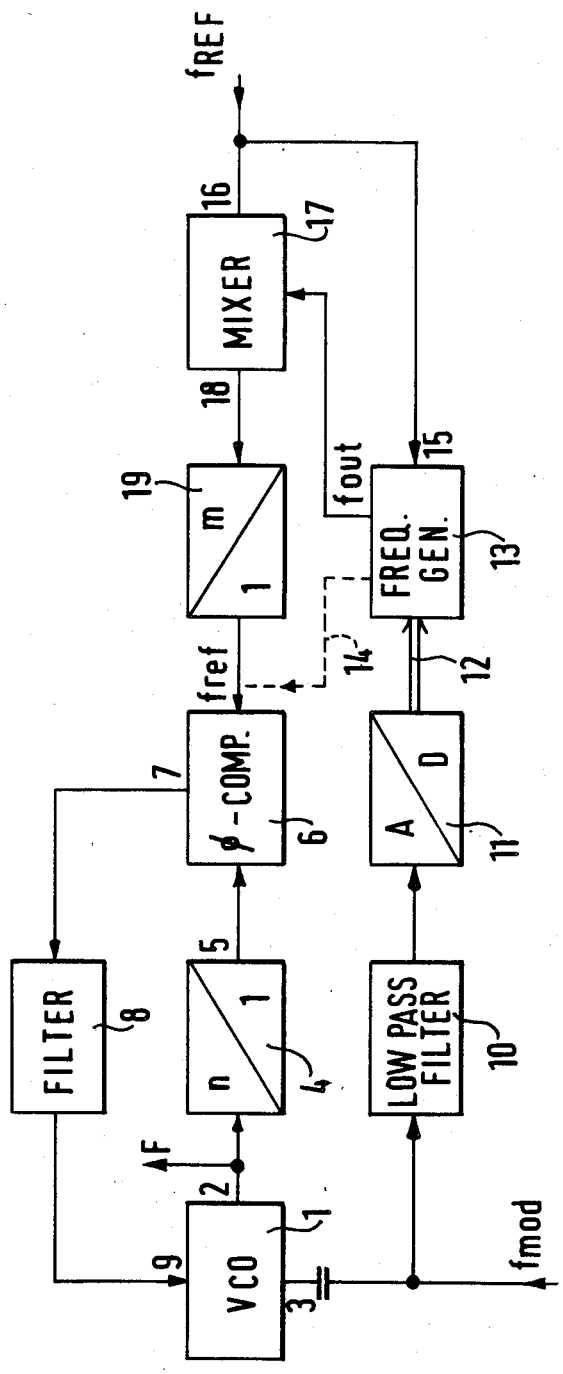

CIRCUIT INCLUDING A DC-FM PHASE LOCKED LOOP

The present invention relates to a circuit including a DC-FM phase locked loop, and is more particularly but not exclusively concerned with such a circuit comprising a voltage controlled oscillator (VCO) having a control input for a modulation signal, a frequency divider connected to the output of said VCO and feeding one input of a phase comparator, a second input of said phase comparator being fed with a reference frequency, and the output of said phase comparator being connected, via a filter, to a frequency control input of said VCO. Such circuits are used, for example, in transmitters for measuring and control purposes.

Prior art circuits of this type suffer from the problem that, with decreasing modulating frequency, the phase locked loop will interpret the frequency fluctuations of the VCO as drifting of the latter, and will consequently tend to counteract such fluctuations. Because of this problem, the lower modulation frequency limit is typically about 20 Hz, unless special solutions to the problem are adopted.

One such solution provides that within a low modulation frequency range, the loop is interrupted, the most recent control signal for the VCO simply being maintained. Accordingly, the VCO may drift without control. Another solution provides a frequency discriminator for the control of the VCO, but such a discriminator has inherent frequency errors.

It is an object of the present invention to provide a circuit of the type described above in which the action of the phase locked loop is maintained even when the modulation frequency is low.

According to the present invention, there is provided a circuit including a DC-FM phase locked loop, the circuit comprising a variable frequency oscillator having a control input for a modulation signal, a frequency divider connected between the output of said oscillator and one input of a phase comparator, a second input of said phase comparator being connected to receive a reference frequency, and the output of said phase comparator being connected, via a filter, to a frequency control input of said oscillator, wherein a quartz-stabilized but frequency-variable frequency generator is provided for the generation of said reference frequency, and wherein said modulation signal is fed via a low pass filter to the input of an analog-to-digital converter for conversion to corresponding digital signals, which are fed to control inputs of said frequency generator so as to cause the output reference frequency produced by said generator to fluctuate, in response to low frequency and DC components of said modulation signal, by substantially the same amount as the output frequency of said frequency divider.

Accordingly, with modulation frequencies well above those at which the phase locked loop commences to tend to counteract the modulation, the reference frequency at the phase comparator already commences to fluctuate in the same direction and in the same or quasi-same amount, so that the error signal at the phase comparator output tends to zero.

Preferably, the digital signals derived from the modulation signal are used for controlling the output of a frequency synthesizer, which can be provided with a resolution (as the case may be by means of additional components) as fine as desired. The circuit may be used with advantage even if the VCO is modulated with a relatively high frequency, even when so modulated in an asymmetric manner so that the modulation signal comprises ultimately a considerable DC component.

The invention will now be described, by way of example only, with reference to the accompanying drawing, which is a simplified block diagram of a circuit in accordance with the present invention.

A voltage controlled oscillator (VCO) 1 produces at its output 2 a signal having a carrier frequency F which, by means of a signal $f_{mod}$ fed to a first control input 3, is frequency modulated. Output 2 is further connected to the input of a frequency divider 4 which divides the output frequency with a ratio n:1. Divider output 5 is connected to a first input of a phase comparator 6, whose second input is fed with a quartz-stabilized reference frequency $f_{ref}$. The resulting error signal at output 7 of the phase comparator is passed via a low pass filter 8 to a second control input 9 of VCO 1. Control inputs 3 and 9 of the VCO 1 could affect one and the same component, say a varactor diode, but it is preferred to use two distinct components having different characteristics.

The signal $f_{mod}$ is also applied to the input of a low pass filter 10. The time constant of the latter is adapted to that of filter 8 such that the filter 8 is substantially "slower" than the filter 10. For example, the filter 8 may have a pass band of 1 Hz while the filter 10 has its upper limit at, say, 500 Hz. The output of the filter 10 is connected to the input of an analog-to-digital converter 11 which produces, in response to its input amplitude, binary-coded output signals which are transmitted in parallel via bus 12 to control inputs of a frequency generator 13. The latter is preferably a frequency synthesizer which upon being switched will not exhibit phase jumps and may immediately supply the quartz-stabilized reference frequency to the respective input of phase comparator 6. This is indicated by the broken line 14.

The frequency generator 13 is controlled by the signals on bus 12 such that its output frequency changes in the same amount as the frequency of VCO 1, after division by divider 4, will vary due to control signal $f_{mod}$. Consequently, both inputs of the phase comparator will fluctuate in identical sense and by the same amounts so that no error signal is produced and the slow $f_{mod}$-modulations will not be counteracted.

In the preceding paragraph, the term "same amounts" is not entirely correct, because the frequency synthesizer 13 cannot be continuously tuned but exhibits incremental frequency changes, the minimum increment being defined by one least significant bit on bus 12. This defines also the best resolution capability.

To minimize this drawback, the alternative embodiment shown in solid lines is preferred. A quartz-stabilized reference frequency $f_{REF}$, applied at input 15 of generator 13, serves as the frequency basis of the latter. The same frequency is fed to a first input of mixer circuit 17 (at input 16) while the second input of the mixer is fed with the output signal $f_{out}$ of generator 13. At the output 18 of mixer 17, accordingly, the sum (or difference) of $f_{REF}$ and $f_{out}$ is available and is applied, via divider 19, to the phase comparator 6. The division ratio m:1 is accordingly selected under consideration of $f_{REF} \pm f_{out}$.

The resolution capability of the system is thereby improved by the factor $f_{REF}/f_{out}$, and for this reason $f_{REF}$ is selected to be considerably higher than $f_{out}$. It should be remembered that $f_{out}$ is normally not constant, but incrementally changing in response to signals on bus 12 (it would be possible to define $f_{out}$ in the format $f_{nom} \pm f_{corr}$, where $f_{nom}$ is the nominal frequency of generator 13 with absence of a signal $f_{mod}$, and $f_{corr}$ is the correction signal due to the presence of an input signal of A/D converter 11).

In an implemented circuit, the following data applied:
Nominal frequency of VCO 1: 480 MHz
n = 1000
$f_{ref}$ = 480 KHz
$f_{REF}$ = 10.5 MHz
$f_{out}$ = 60 KHz
Frequency at mixer output (sum) = 10.56 MHz
m = 22
$f_{REF}/f_{out}$ = 175.

The figures given above are to be considered as exemplary only.

The VCO 1 was made up from discrete components, its control input 3 being substantially linear. Frequency dividers are readily available, the mixer 17 was a simple diode mixer. A low pass filter of first or second order may be used as filter 8, and a simple RC-component may be used as low pass filter 10. As the A/D converter, circuit IC AD 573 manufactured by the company Analog Devices, Norwood, Mass. U.S.A. was used. The frequency synthesizer used was of a type wherein a change of one least significant control bit will result in an output frequency change of 0.6 Hz.

I claim:

1. A circuit including a DC-FM phase locked loop, the circuit comprising a variable frequency oscillator having a control input for a modulation signal, a frequency divider connected between the output of said oscillator feeding one input of a phase comparator, a second input of said phase comparator being connected to receive a reference frequency, and the output of said phase comparator being connected, via a filter, to a frequency control input of said oscillator, wherein a quartz-stabilized but frequency-variable frequency generator is provided for the generation of said reference frequency, and wherein said modulation signal is fed via a low pass filter to the input of an analog-to-digital converter for conversion to corresponding digital signals, which are fed to control inputs of said frequency generator so as to cause the output reference frequency produced by said generator to fluctuate, in response to low frequency and DC components of said modulation signal, by substantially the same amount as the output frequency of said frequency divider.

2. A circuit as claimed in claim 1, wherein said frequency generator is arranged to change frequency substantially without phase jumps.

3. A circuit as claimed in claim 1, wherein the frequency generator output signal is directly fed to said phase comparator as the reference frequency for the latter.

4. A circuit as claimed in claim 1, wherein the frequency generator output is mixed with a substantially higher quartz-stabilized frequency and the frequency mix is fed to the input of a frequency divider having a division ratio such that said reference frequency will be produced at its output.

5. A circuit as claimed in claim 4, wherein said quartz-stabilized frequency is fed to said frequency generator as a frequency basis thereof.

* * * * *